US008841919B1

(12) United States Patent
Zivi et al.

(10) Patent No.: US 8,841,919 B1
(45) Date of Patent: Sep. 23, 2014

(54) UNDER WATER CONNECTOR WITH SEALED ACCESS PORT

(75) Inventors: Daniel F. Zivi, Severna Park, MD (US); Charles L. Robbins, Jr., Stevensville, MD (US); Joseph A. Szymborski, Silverdale, WA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 562 days.

(21) Appl. No.: 13/234,038

(22) Filed: Sep. 15, 2011

(51) Int. Cl.
*G01R 31/04* (2006.01)

(52) U.S. Cl.
USPC ........... 324/538; 439/271; 439/274; 439/275; 174/60; 174/74 R

(58) Field of Classification Search
None
See application file for complete search history.

(56) References Cited

U.S. PATENT DOCUMENTS

| | | | |
|---|---|---|---|
| 3,602,873 | A | 8/1971 | Childers |
| 3,701,835 | A | 10/1972 | Eisele et al. |
| 3,725,581 | A | 4/1973 | Gillemot et al. |
| 3,781,461 | A | 12/1973 | Thompson et al. |
| 4,025,145 | A | 5/1977 | Shaffer et al. |
| 4,479,690 | A | 10/1984 | Inouye et al. |
| 4,797,117 | A | 1/1989 | Ayers |
| 4,936,478 | A | 6/1990 | Bozdeck |
| 5,246,379 | A | 9/1993 | Wright |
| 5,380,224 | A | 1/1995 | DiCicco |
| 6,162,082 | A | 12/2000 | Karsten |
| 6,916,193 | B2 | 7/2005 | Varreng et al. |
| 7,504,580 | B2 | 3/2009 | Lammens |
| 2003/0026662 | A1 | 2/2003 | Vidal et al. |
| 2009/0176416 | A1 | 7/2009 | Flynn |

FOREIGN PATENT DOCUMENTS

| | | |
|---|---|---|
| EP | 566090 | 10/1993 |
| GB | 2035719 | 6/1980 |

*Primary Examiner* — Melissa Koval
*Assistant Examiner* — Stephen G Armstrong
(74) *Attorney, Agent, or Firm* — Marsteller & Associates, P.C.

(57) ABSTRACT

A repairable waterproof connector assembly (200) provides an access port (212) within the connector housing (201) to support wire management required for removal and reinstallation of the electrical insert (202) which can be achieved without removing the connector assembly (200) from its cable. Adding this access capability greatly reduces the time required to repair a damaged connector assembly (200). Wire management within the connector assembly (200) includes manipulating a wiring service loop (207) via access provided by the access port (212). Wire management supports access to reposition, remove, test and repair the electrical insert (202) having electrical pins and contacts (211). In applications requiring waterproof connectors, having the ability to test and repair the connector assembly without removing or cutting it from its cable is a significant timesaver and reduces cost.

16 Claims, 5 Drawing Sheets

UNDER WATER CONNECTOR WITH SEALED ACCESS PORT

BACKGROUND OF THE INVENTION

1. Technical Field

The invention relates to the field of electrical connectors, and more particularly to repairable waterproof electrical connector assemblies capable of supporting multi-conductor cable and contact packages that are housed in a mechanically rigid connector assembly.

2. Background Art

Electrical connectors are used generally by automotive, marine, air, consumer and industrial product and process applications for the distribution of electrical power and signals. Virtually every item of modern-day life is affected by electrical connectors and whether they perform well or fail and require maintenance or replacement.

Of particular importance are connectors applied to underwater or water exposed environments and therefore need to be waterproof. The process of designing for waterproof performance or waterproofing existing connectors often renders them unrepairable requiring them to be replaced if they fail. Components of the connector assembly requiring attention for repair include its wiring, electrical inserts that interface with this wiring, and the contacts and pins designed to mate with system fixtures.

This invention teaches a design and method of providing an access port to an underwater connector housing so that removal of the insert and wire management can be achieved without replacing the entire connector. Adding this access capability greatly reduces the time required to repair a damaged cable assembly.

When damaged, by corrosion, electrical stresses, mechanical stresses, or other influences, the connector electrical insert usually cannot be removed from the housing, so the entire connector has to be scrapped and cut from the cable assembly.

Removing the connector requires a significant amount of time and in some cases requires shortening the length of the cable assembly, because in some cases the connector must be cut off completely to be able to disassemble. Cutting off the connector shortens the cable assembly and causes a risk of the entire cable being scraped, if the cable is now too short for the intended application.

Underwater connectors typically consist of an outer metal housing, electrical insert, an insert retainer, wiring and o-ring seals. The connector assembly is usually permanently attached to the electrical cable. The entire cable assembly, with the connector attached, is fabricated of one of two different methods: either oil filled pressure compensated or a molded assembly. Once the cable is assembled in either of these configurations and an electrical pin in the electrical insert is broken or damaged (during connector attachment for example), it is usually not possible to remove or service the insert without removing the entire connector from the cable.

Typically, in marine or other underwater applications, the connector assembly which has a malfunctioning electrical insert contains several pins that are missing or damaged effecting an entire section of the insert. This electrical insert cannot be removed from the housing or even reached typically, and therefore the entire connector has to be scrapped and must be cut from the cable assembly. It is often the case that the cable cannot afford to have its length shortened and must be replaced entirely. This is a daunting task as the other end of the cable assembly can be intricately connected to multiple sites at its functioning end.

Prior art defining connector assemblies is known. For example, U.S. Pat. No. 6,916,193 issued to Varreng, Jan Sverre et al. on Jul. 12, 2005 discusses in situ repair. Specifically, the cable 20 is pushed through the aperture slit 17 of the rubber diaphragm 11 and through the rubber wiper 10; the compound 12 starts to be pressed out through the holes 8 by lifting the rubber layers 21 and 22 of the wiper 10 and the diaphragm 11, with the layers 21 and 22 covering the holes 8. The rubber diaphragm 11 and the rubber wiper 10 wipe off the water from the entering cable 20. In a second step, the cable 20 is pushed further into the chamber 19 and compound 12 is pressed out at the interface between the element 23 and the cable 20 and then through the holes 8 (col 4, 12-23). This art is suitable for repairing damage of subsea electrical cables used for heating subsea pipelines, but not for the construction and repair of multi-pin connector assemblies with removable electrical inserts.

U.S. Pat. No. 3,602,873 issued to Childers, Thomas W. on Aug. 31, 1971 discusses an opening that permits access. With the cap 20 off the container (FIG. 1), or the trapdoor 20A swung open (FIG. 2), or the slide door 20B slid open, the diver then inserts one hand through the opening 16 or 16A and grasps the second electrical connector, which he elevates in container 12 through interface 23 into fluid 21 until it is juxtaposed to the first electrical connector with which it is matingly connectable (col 4, 15-25). This art is suitable for enclosing connections underwater, but does not address the repair of multi-pin connector assemblies with removable electrical inserts.

US Published Patent Application No. 20030026662 to Vidal, Ronald J. et al. published on Feb. 6, 2003 discusses providing service access. The aim is to cut out a half shell aperture 422 to gain access to the cables within, as shown in FIG. 43. Preferably, the aperture in the pipe provides access for cable inspection and repair. The duct further has at least one opening or removable and resealable access panel that provides access to the interior of the duct. This art is suitable for enclosing connections underwater and allowing limited maintenance, but does not address the repair of multi-pin connector assemblies with removable electrical inserts.

However, such a repairable underwater connector assembly has not been used in the field of automotive, marine, air, consumer and industrial product design, manufacturing, and processing. Outdoor plastic and metal electrical boxes and connectors have utilized access covers to manage wires, but the use of the method of the present invention on an underwater connector is not known to have been applied. Specifically, existing known underwater connectors are not known to have an access port, for wire management and insert removal.

While the above cited references introduce and disclose a number of noteworthy advances and technological improvements within the art, none completely fulfills the specific objectives achieved by this invention.

DISCLOSURE OF INVENTION

As well-known approaches have provided improvements over prior designs, the challenges in the field of repairable waterproof connector assemblies have continued to increase with demands for more advanced electrical systems subject to presence of or emersion in water. Therefore, a need has arisen for new methods and systems that are capable of providing the desired increase in electrical system sophistication operable in these challenging environments.

In accordance with the present invention, a design and method for a cable assembly includes a repairable waterproof connector assembly that provides an access port within the connector housing so that removal of the electrical insert and wire management can be achieved without removing the entire connector. Adding this access capability greatly reduces the time required to repair a damaged cable assembly. Wire management within the connector assembly includes having access to test, reposition, remove, and replace the electrical insert having electrical pins and contacts for mating to its counterpart connector. In underwater applications and other applications requiring waterproof connectors, having the ability to test and repair the connector assembly without removing said connector from the cable or cutting the cable is a significant timesaver and cost reducer not to mention the benefits of lessening the problems associated with the down system time experienced by the users of said system.

To be able to remove the electrical insert without removing the entire connector from the main cable requires a service loop of wire below the insert so that the insert can be pulled out and the wires tested, unsoldered, a new insert re-soldered and, while reinstalling the insert, a method of managing these wires is necessary to ensure that they are not damaged or pinched during reassembly. In application, the electrical insert can be pushed into the connector assembly housing while the wires are managed thru the access port. In accordance with the present invention, large numbers of wires that make up stiff cable assemblies are accounted for by providing a wiring service loop for the purposes of wire management. Said wire management cannot be performed unless access behind the electrical insert is provided where the electrical insert can be pulled out far enough to be able to un-solder the wires and replace the insert with a new one.

Adding an access port to the rear of the connector housing allows access to manage the wires as the electrical insert is installed, repositioned, or removed. This access port is sealed to maintain waterproof operation, for example with an O-ring. In one embodiment of the present invention, the configuration of receptacle interface seal O-ring used is the same size as the O-ring which is used to seal around the electrical insert (refer to FIG. 2). Using this same seal minimizes the addition of different sealing parts, and adds an already proven seal configuration.

In accordance with the present invention, the connector assembly must be removed from the system receptacle, with which it is normally attached in normal operation, in order for the electrical insert to be serviced via wire management through the access port. An additional embodiment of the present invention is adapted to support a desired number of test ports located on the side of the connector assembly housing that allow in situ testing and characterization of the power and signals conducted by the electrical insert. The configuration of this embodiment supports applications where the nature of the wires within the connector do not allow for in situ testing and characterization from behind the insert via the access port. In situ testing and characterization of wiring and electrical contacts and pins within the electrical insert via the test port(s) can be performed without having to cease system operation or move or unseal said connector. Given unfavorable testing, or other critical test results, the connector can be disconnected from the system receptacle and the access port can be opened allowing full access, movement, and the removal of the electrical insert. Given favorable testing, or other critical test results, the connector does not have to be disconnected from the system receptacle and the access port does not have to be opened and the positive status of this connector can be recorded. In this way the status and traceability of testing can be performed and documented allowing for reviewable management of critical connector assemblies.

Embodiments of the present invention provide a system and method for maintaining and servicing cables that need to be repaired due to corrosion of the connector housings, wires, electrical insert, or contacts or pins. Prior to the present invention, replacing the connector assembly housings or any of their components was a process that would shorten these complex cable assemblies. The present invention answers the need to be able to field repair any of these connector assemblies or their components without shortening or removing the entire connector housing.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

Figure 1:
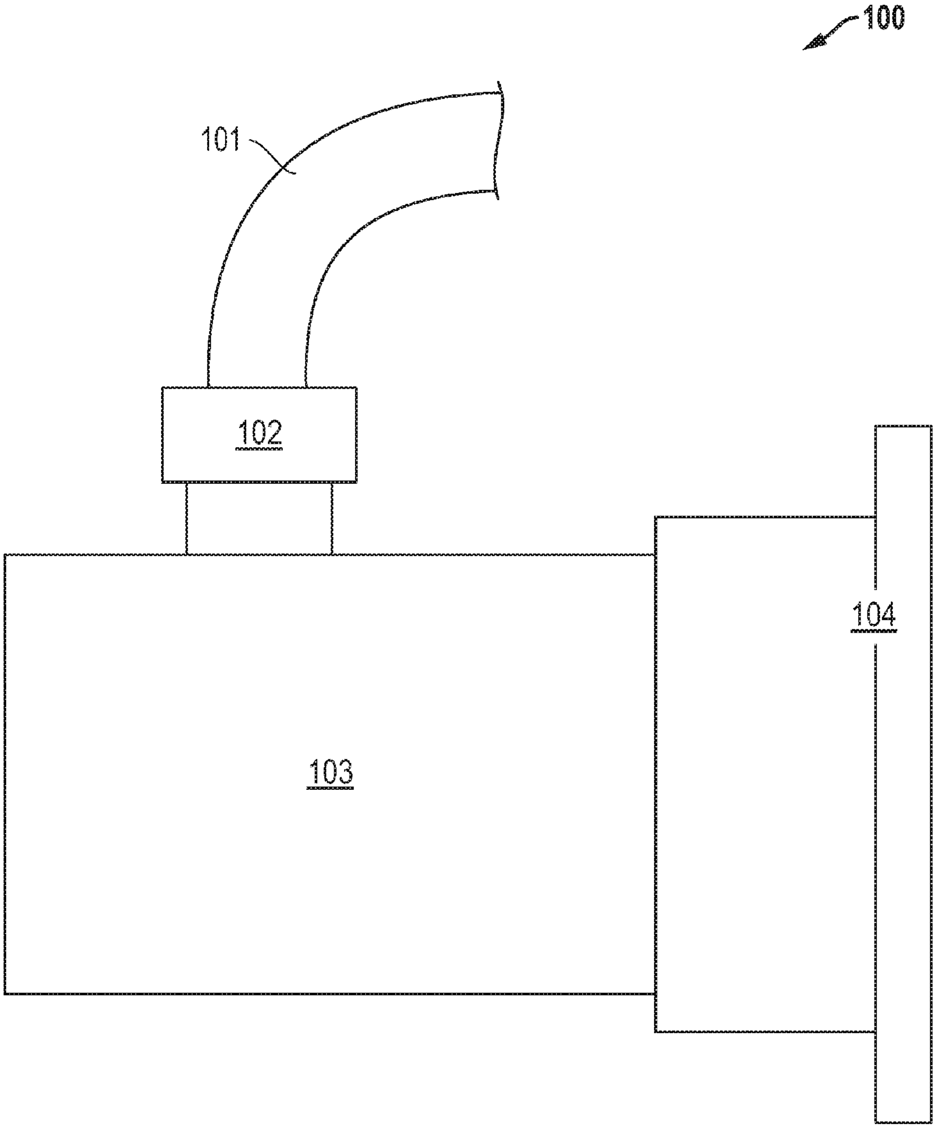
FIG. 1 is a side view of the main cable assembly with repairable waterproof connector assembly of the present invention and system receptacle.

FIG. 1 illustrates a main cable assembly with a repairable waterproof connector assembly and a system receptacle. The major components of the main cable connector assembly 100 are a main cable 101, a main cable interface 102, a main connector assembly 103, and a system receptacle. The main cable 101 can carry electrical power wires, signals wires, shielding, or even main cable wiring spacers which are not conductors and can be used to achieve a preferred arrangement of all wires and shielding within the main cable 101. The main cable 101 attaches to the main connector assembly 103 by means of the main cable interface 102. In accordance with the present invention, this interface can be permanent whereby future detachment of the main cable 101 from the main connector assembly 103 is not possible without cutting the main cable 101. Embodiments of the present invention allow for the main cable interface 102 to support detachment and reattachment without cutting the main cable 101. The system receptacle interface 104 is designed specifically for mating with the main connector assembly 103. The entire main cable connector assembly 100 is specified by this invention to be operable underwater and repairable without the loss of main cable connector assembly components or any changes to the length of the main cable 101.

Figure 2:
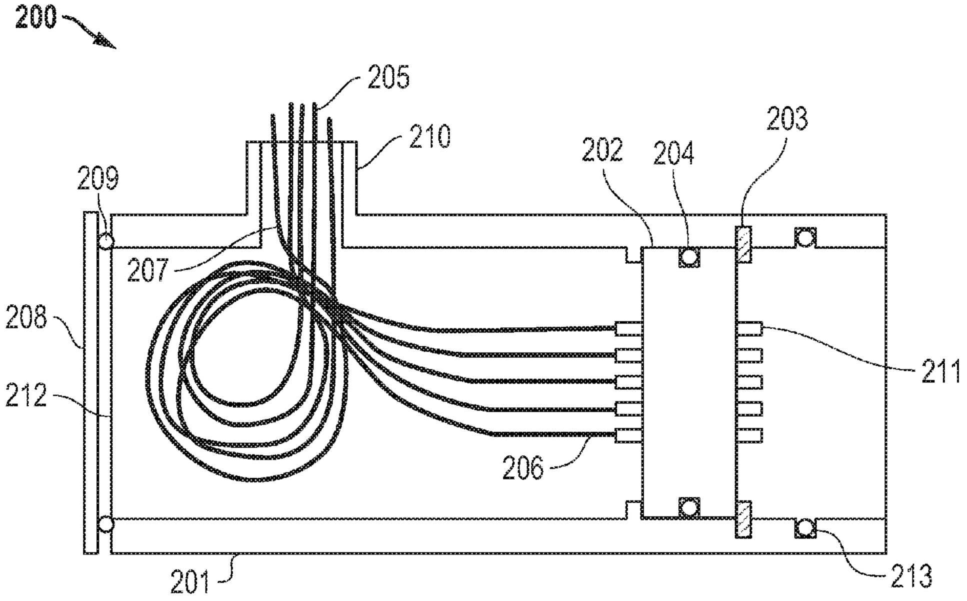
FIG. 2 is a side view of a repairable waterproof connector assembly with access port, electrical insert, one insert retainer ring with seal, and contacts and pins.
Figure 3:
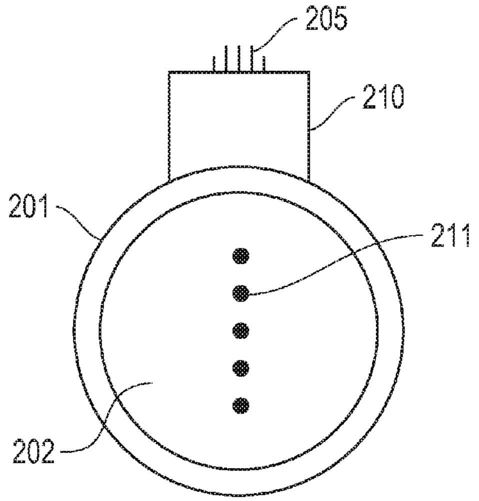
FIG. 3 is a front view of a repairable waterproof connector assembly with access port, electrical insert, one insert retainer ring with seal, and contacts and pins.

FIGS. 2 and 3 illustrate a side and front view respectively of a repairable waterproof main connector assembly. The main connector assembly 200 is composed of a rigid housing 201 that contains an electrical insert 202, an insert retainer 203, an insert retainer seal 204, a set of wires 205, a set of wires to insert connections 206, and a wire service loop 207. In accordance with the present invention, the rigid housing 201 supports a connector main cable interface 210 and an access port 212 with a removable access port cover 208 and an access port seal 209 for gaining access to said wire service loop 207 that supports manipulation of the electrical insert 202 and maintaining a waterproof seal. The electrical insert 202 includes electrical contacts or pins 211 for electronically mating to the system receptacle interface 104 (of FIG. 1) with receptacle interface seal 213.

Electrical insert 202 is accessed by disconnecting the main connector assembly 200 from the system receptacle and removal of the access port cover 208 and the access port seal 209. Further, removing of the insert retainer 203 and the insert retainer seal 204 is achieved. Manipulation of the wire service loop 207 can now allow the electrical insert to be repositioned or removed for testing and inspection of the wires to insert connection 206 and electrical contacts and pins 211. In accordance with the present invention, wire and connector management can be performed with the connector assembly 200 detached from the system receptacle interface 104, but the connector assembly 200 does not have to be separated from the main cable. All main connector assembly 200 maintenance and repair can be accomplished without the removal of the connector assembly 200 from the main cable.

With further reference to FIGS. 2 and 3, The main cable assembly 200 can be reattached to the system receptacle 104 by first repositioning the electrical insert 202 back within the connector assembly housing 201. This can only be achieved by utilizing access provided by the open access port 212 in order to manipulate and reposition the difficult to move set of wires 205 and wire service loop 207. The insert retainer 203 and the inset retainer seal 204 can now be tightened back into their original position thus holding firm electrical insert and re-creating the waterproof seal at the electrical insert 202. The main connector assembly 200 can now be fastened back onto the system receptacle 104 per that connections specifications.

Figure 4:
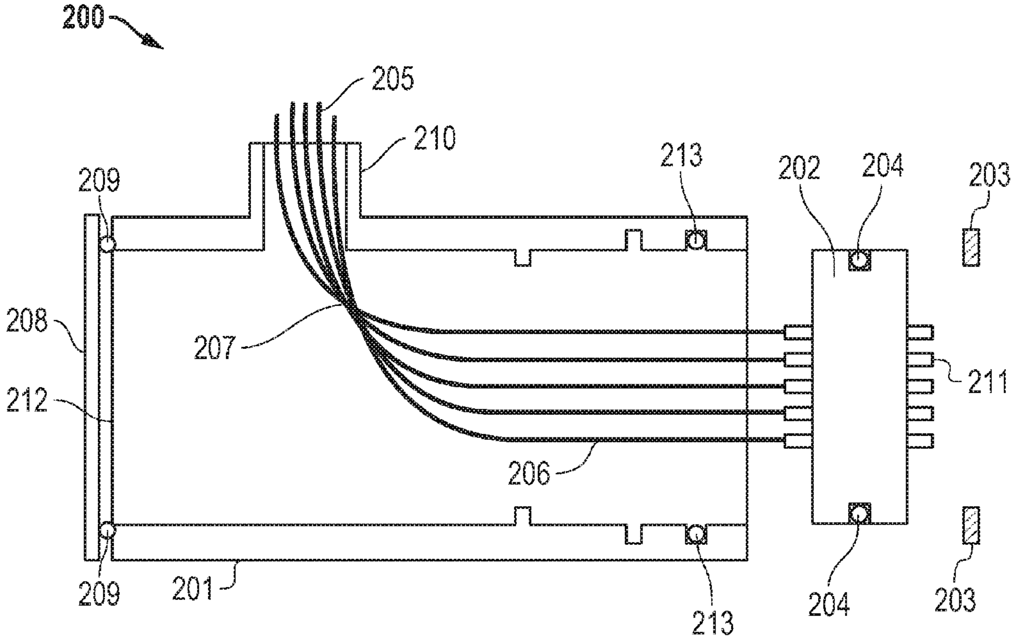
FIG. 4 is a side view of a repairable waterproof connector assembly with access port and electrical insert removed from the housing.

FIG. 4 illustrates a repairable waterproof main connector assembly with electrical insert removed from the housing. The main connector assembly 200 has been removed from the receptacle interface 104 and the insert retainer 203 and insert retainer seal 204 have been removed from the rigid housing 201. This allows removal of the electrical insert 202 by utilizing access provided by the open access port 212 in order to manipulate and reposition the difficult to move set of wires 205 and wire service loop 207 while removing said electrical insert 202. The wires to insert connection 206 and the electrical contacts or pins 211 can now be inspected, tested, prepared, or replaced.

In accordance with the present invention, wire and connector management can be performed with the connector assembly 200 detached from the system receptacle interface 104, but the connector assembly 200 does not have to be separated from the main cable. All main connector assembly 200 maintenance and repair can be accomplished without the removal of the connector assembly 200 from the main cable.

With further reference to FIG. 4, the main cable assembly 200 can be reattached to the system receptacle 104 by first repositioning the electrical insert 202 back within the connector assembly housing 201. This can only be achieved by utilizing access provided by the open access port 212 in order to manipulate and reposition the difficult to move set of wires 205 and wire service loop 207. The insert retainer 203 and the inset retainer seal 204 can now be tightened back into their original position thus holding firm electrical insert and re-creating the waterproof seal at the electrical insert 202. The main connector assembly 200 can now be fastened back onto the system receptacle 104 per that connections specifications.

Figure 5:
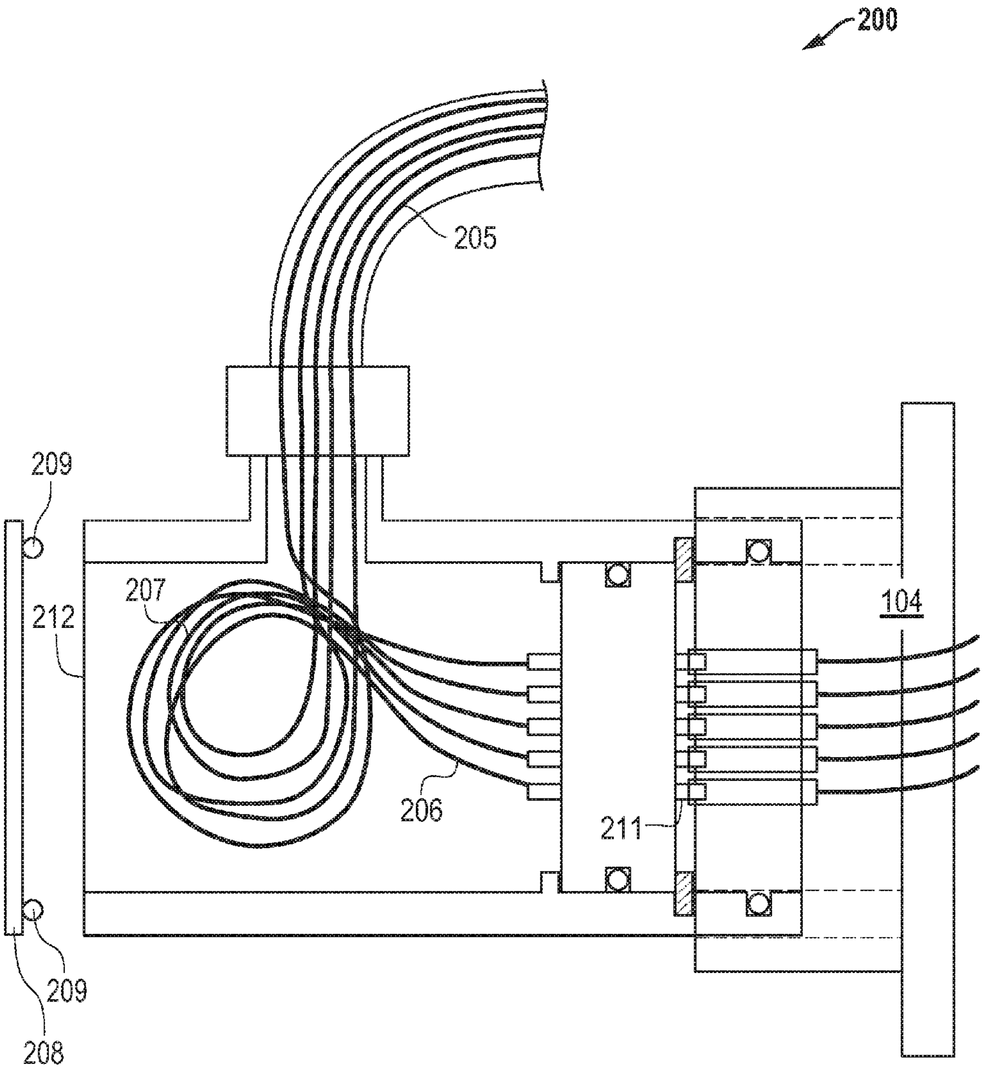
FIG. 5 is a side view of a repairable waterproof connector assembly connected to the receptacle interface and with access port opened for in sin, testing.

FIG. 5 illustrates a side view of a repairable waterproof connector assembly connected to the receptacle interface 104 and with the access port opened for in testing. The access port 212 as been exposed by the removal of the access port cover 208 while the main connector assembly 200 is connected to the receptacle interface 104. This configuration allows for the in situ testing of the wires to insert connection 206 and the electrical contacts or pins 211 to evaluate their static or dynamic state as connected to the receptacle interface 104 and to determine whether any components need to be replaced. This is possible when the set of wires 205 and the wire service loop 207 do not obstruct access to the wires to insert connection 206.

Figure 6:
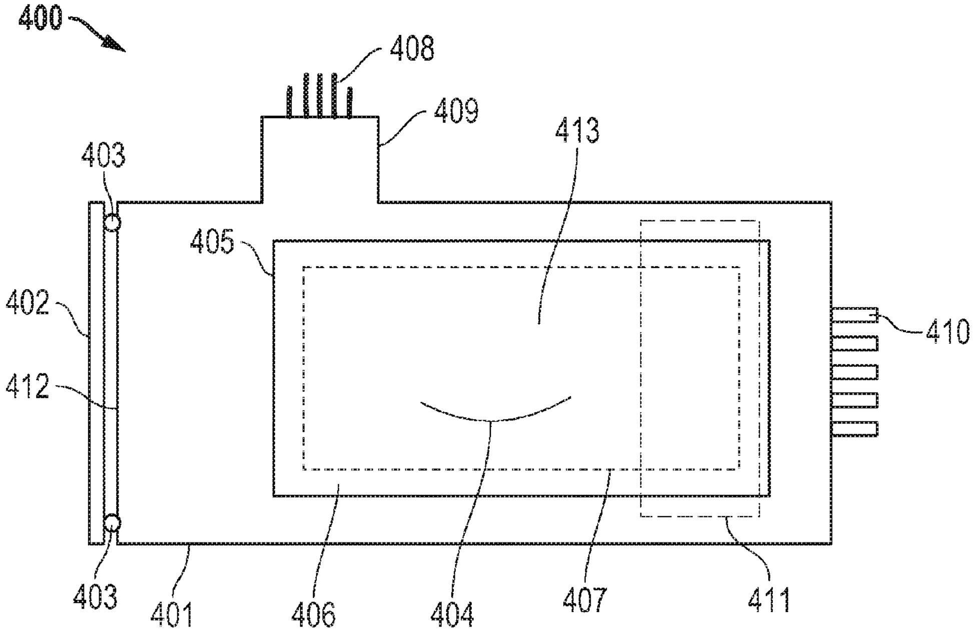
FIG. 6 is a side view of a repairable waterproof connector assembly with test port, access port, electrical insert, and contacts and pins.
Figure 7:
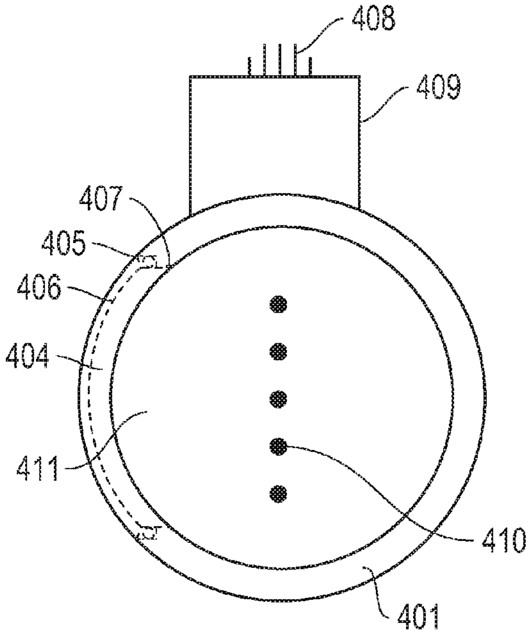
FIG. 7 is a front view of a repairable waterproof connector assembly with test port, access port, electrical insert, and contacts and pins.

FIGS. 6 and 7 illustrate a side and front view, respectively, of a repairable waterproof connector assembly with a test port in combination with an access port. In the illustrated embodiment, the main connector assembly 400 allows for both in situ testing and full service and repair operations with thick, stiff, or inflexible wires that prevent testing access via the access port 412. All of the characteristics illustrated in FIGS. 1 through 5 can be included to apply to this embodiment of the present invention. The main connector assembly 400 is housed within a rigid housing 401 that supports a connector main cable interface 409, an access port 412, and a test port 413. The access port is sealed via an access port cover 402 and an access port cover seal 403. The test port is formed by a test port inner edge 407 and a test port outer edge 405. A test port seal 406 fits between the test port inner edge 407 and the test port outer edge 405. A test port cover 404 makes contact with the test port seal 406 and covers the entire test port 413.

With further reference to FIGS. 6 and 7, the illustrated embodiment of the present invention, a set of wires 408 can be stiff and hard to move and therefore require an open access port 412 to help manipulate the set of wires and the wiring service loop (207 FIG. 2) in order to reposition or remove an electrical insert 411. Removal of the electrical insert 411 allows for testing, servicing, and repair of the electrical insert 411, the set of wires 408, and other electrical insert components such as a set of electrical contacts or pins 410 while the main connector assembly is detached from the system receptacle 104.

With continued reference to FIGS. 6 and 7, the illustrated embodiment of the present invention, with the access port 412 closed and sealed and the main connector assembly 400 connected per specification to the system receptacle interface 104 and the main cable assembly and system in normal operation, in situ measurements and in situ testing can be performed even if the main connector assembly 400 is a mechanically important part of the system and cannot be removed while the system is in operation. The test port 413 can be opened and the test port seal 406 removed to gain access to the electrical insert 411 and the set of wires 408. In situ static or dynamic testing and characterization of the performance and health of the main connector assembly 400 and its components can be performed as well as in situ testing the characterization of the system signals and power supported by the main connector assembly 400. After testing, the test port seal 406 and test port cover 404 can be replaced and resealed per specification. The current embodiment of the main connector assembly 400 with test ports can be adapted to contain a desired number of test ports and is not limited to one single test port 404.

The foregoing disclosure and description of the invention are illustrative and explanatory thereof, and various changes in the size, shape and materials, as well as in the details of the illustrated construction may be made without departing from the spirit of the invention.

What is claimed is:

1. A repairable waterproof connector assembly that includes an access port and a movable electrical insert for wire and connector repair and management, the repairable waterproof connector comprising:

a rigid housing capable of supporting underwater seals;

a movable electrical insert adapted to support desired types of electrical contacts or pins;

an insert retainer means for aligning and holding firm the electrical insert;

a wiring service loop to facilitate wiring installation, maintenance and repair;

an electrical insert sealing means for maintaining waterproof capability of the repairable waterproof connector assembly underwater;

a first connector access port means for allowing manipulation and management of a set of wires to support the movement, removal, or reinstallation of the electrical insert;

a second connector access port means for allowing in situ testing and characterization of wires and electrical contacts or pins;

a connector test port means for allowing in situ testing and characterization of wires and electrical contacts or pins where testing access via the access port is denied due to the size or thickness of the wires; and, an access port cover plate for the second connector access port with sealing means for maintaining waterproof capability of the repairable waterproof connector assembly.

2. The repairable waterproof connector of claim 1 wherein the rigid housing is adapted to support desired mechanical stresses, strains, and torques.

3. The repairable waterproof connector of claim 1 wherein the repairable underwater connector is adapted to hold a desired number of wires and electrical contacts or pins.

4. The repairable waterproof connector of claim 1 wherein the repairable underwater connector is adapted to hold a desired number of replaceable wires and electrical contacts or pins.

5. The repairable waterproof connector of claim 1 wherein the repairable underwater connector permits testing and characterization of the electrical insert while said connector maintains its original mechanical form and rigidity subject to all in situ stresses, strains, and torques.

6. The repairable waterproof connector of claim 1 wherein the wiring service loop is accessible through the access port and formed from all wires and the movable electrical insert.

7. The repairable waterproof connector of claim 1 wherein the repairable underwater connector allows for the implementation of flexible or rigid cables of a fixed length and providing full-service and repair accessibility.

8. The waterproof connector of claim 1 wherein the sealing means for the electrical insert and the receptacle interface are of the same size.

9. A method waterproofing and maintaining a connector for a main cable that contains a rigid connector housing, access port with sealing means, movable electrical insert retainer, and movable electrical insert with seal including electrical wire, wiring service loop, electrical contacts, and electrical pins, comprising the steps of:

testing connector cable wires and the electrical insert with contacts and pins by removing the access port and access port sealing means for maintaining a waterproof seal in order to gain access to the connector cable wires and the electrical insert;

testing the connector cable wires and the electrical insert with contacts and pins by removing a test port and test port sealing means for maintaining a waterproof seal in order to gain access to the connector cable wires and the electrical insert where said access via the access port is blocked by the size or thickness of the wires; leaving the main cable in its normal position and at its normal fixed length during maintenance;

removing the main connector assembly from the receptacle interface;

removing the electrical insert retainer to allow movement of the electrical insert;

repositioning the electrical insert to gain access to the wiring service loop running from the main cable to the electrical contacts or pins within the electrical insert;

performing repairs on or replacement of said wires, electrical insert, or electrical contacts or pins;

repositioning the electrical insert to its original position making full contact with all insert seals;

reinstalling the electrical insert retainer to its original position and mechanical configuration;

reinstalling access port and access port sealing means replicating the original position and seal integrity of the access port; and, reinstalling the test port with test port sealing means replicating the original position and seal integrity of the test port.

10. The method of claim 9 wherein the connector for the main cable possesses a rigid housing that is adapted to support desired mechanical stresses, strains, and torques.

11. The method of claim 9 wherein the connector for the main cable is adapted to hold a desired number of wires and electrical contacts or pins.

12. The method of claim 9 wherein the connector for the main cable is adapted to hold a desired number of replaceable wires and electrical contacts or pins.

13. The method of claim 9 wherein the connector for the main cable permits testing and characterization of the electrical insert while said connector maintains its original mechanical form and rigidity subject to all in situ stresses, strains, and torques.

14. The method of claim 9 wherein the connector for the main cable possesses a wiring service loop accessible through the access port and is formed from all wires and the movable electrical insert.

15. The method of claim 9 wherein the connector for the main cable allows for the implementation of flexible or rigid cables of a fixed length and providing full-service and repair accessibility.

16. The method of claim 9 wherein the connector for the main cable possesses a sealing means for the electrical insert and the receptacle interface that are of the same size.

* * * * *